United States Patent
Iijima et al.

(12) 
(10) Patent No.: US 6,750,143 B1
(45) Date of Patent: Jun. 15, 2004

(54) METHOD FOR FORMING A PLATING FILM, AND DEVICE FOR FORMING THE SAME

(75) Inventors: Tadashi Iijima, Yokohama; Tetsuo Matsuda, Tano-gun, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/370,888

(22) Filed: Aug. 10, 1999

(30) Foreign Application Priority Data

Aug. 11, 1998 (JP) .......................................... 10-227111

(51) Int. Cl.[7] .............................................. H01L 21/44
(52) U.S. Cl. ....................................... 438/678; 438/687
(58) Field of Search ................................ 438/678, 687, 438/689

(56) References Cited

U.S. PATENT DOCUMENTS 5,183,972 A * 2/1993 Duane et al. ................ 174/251
5,256,565 A * 10/1993 Bernhardt et al. ........... 437/228
5,723,387 A * 3/1998 Chen ........................... 438/692
5,830,805 A * 11/1998 Schacham-Diamand .... 438/678
5,837,609 A * 11/1998 Todd et al. .................. 438/678

FOREIGN PATENT DOCUMENTS

JP  6-268076  9/1994
JP  7-099196  4/1995

* cited by examiner

Primary Examiner—Vu A. Le
Assistant Examiner—Brad Smith
(74) Attorney, Agent, or Firm—Finnegan, Henderson, Farabow, Garrett & Dunner, L.L.P.

(57) ABSTRACT

A desired plating film is formed on a surface of a substrate to be treated by performing a film-depositing step based on electroless plating and an etching step alternately and repeatedly. In the film-depositing step, an electroless plating solution is supplied from a nozzle to the surface of the substrate. In the etching step, an etching solution is supplied from a nozzle to the surface of the substrate.

10 Claims, 4 Drawing Sheets

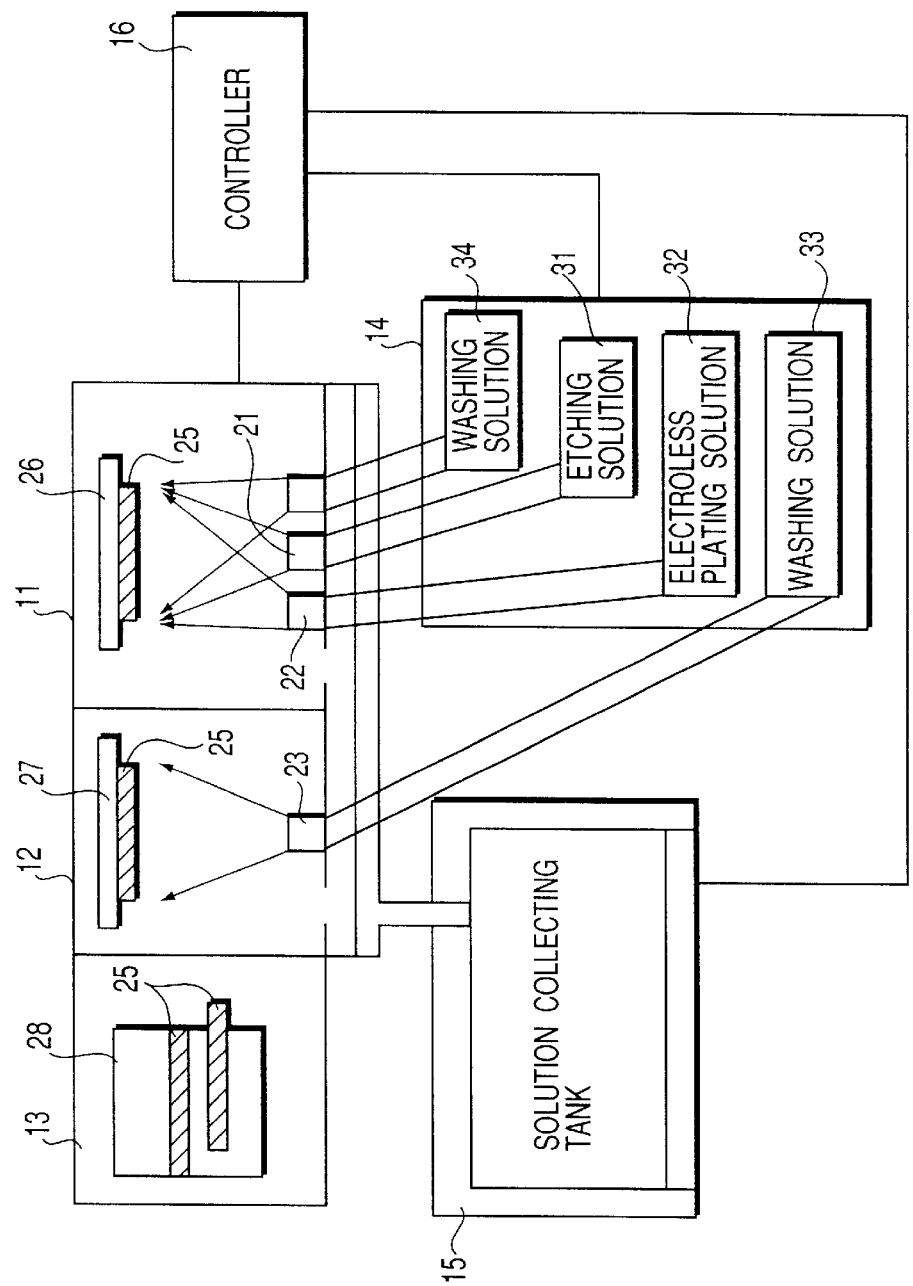
F I G. 5

METHOD FOR FORMING A PLATING FILM, AND DEVICE FOR FORMING THE SAME

BACKGROUND OF THE INVENTION

As one of methods for forming a metal film, there is known a method using electroless plating. As shown in FIG. 7, in the method using electroless plating in the prior art, an electroless plating solution 52 is put into a plating tank 51, and then a semiconductor wafer 54 supported by a support 53 is immersed in the electroless plating solution 52 to form a metal film.

In such a type of conventional method for forming a plating film, however, the following problems arise. As shown in FIG. 8, there arises a problem that if a plating film 63 is formed on an underlayer 61 (for example, a silicon substrate or an insulating film) through a seed layer 62, the surface of the plating film 63 comes to have unevenness. Moreover, there arises a problem that dust is generated.

BRIEF SUMMARY OF THE INVENTION

In the light of the above-mentioned situation, the present invention has been made. It is therefore an object of the present invention to provide a method, for forming a plating film by electroless plating, which makes it possible to make the surface of the plating film smooth, and a device for forming such a plating film.

The inventors have found that in conventional methods of forming a film by electroless plating a smooth plating film cannot be obtained for the following reason. That is, in the case wherein an underlayer has such a nuclei (singular point) that grows abnormally, the degree of the growth of the plating film increases abnormally on the basis of the fact that the plating film increases continuously. Besides, the inventors have found that the above-mentioned singular point also causes dust. The present invention has been made on the basis of such news findings.

That is, the method of forming a plating film according to the present invention comprises the steps of providing a substrate to be treated; and performing, alternately (continuously) and repeatedly, a film-depositing step based on electroless plating and an etching step, thereby forming the plating film on a surface of the substrate.

According to the present invention, by repeating the film-depositing step based on the electroless plating and the etching step alternately, the electroless plating film can be formed while an abnormal growth region of the electroless plating film, which is caused by the singular point of the underlayer or the like, is etched. For this reason, the formed electroless plating film (in particular, the metal plating film) can be made smooth and excellent in step coverage.

In the case that the film-depositing step based on the electroless plating and the etching step are alternately repeated, the following methods may be considered: a method of putting a plating solution and an etching solution alternately into a bath holding the substrate to be treated, or a method of providing a bath in which a plating solution is put and a bath in which an etching solution is put, separately, and immersing the substrate to be treated in the baths alternately. In these methods, however, it is difficult to replace the treating solution instantaneously and carry the substrate instantaneously. In the present invention, therefore, it is preferred to deposit the electroless plating film by the following methods.

(A) In the film-depositing step, an electroless plating solution is ejected (sprayed) onto the surface of the substrate to be treated, and in the etching step, an etching solution is ejected (sprayed) onto the surface of the substrate. Concretely, it is preferred that an electroless plating solution and an etching solution are alternately ejected from the tip of the nozzle to the surface of the substrate to be treated.

(B) In the film-depositing step, the substrate to be treated is immersed in an electroless plating solution to perform the electroless plating (film-depositing step), and then the electroless plating solution used in the film-depositing step is used (in the same bath) to perform applied reverse electric bias etching.

Another method for forming a plating film according to the present invention comprises the steps of performing, repeatedly (and continuously), a film-depositing step based on electroless plating, an etching step and a washing step, thereby forming a desired plating film on a surface of the substrate to be treated.

This method is a method wherein the washing step is further added to the film-depositing step based on the electroless plating and the etching step. In this case, the formed electroless plating film can be made a smooth and continuous in the same way as in the above-mentioned method for forming the plating film according to the present invention.

In this case, there can be used a method of repeating the film-depositing step, the etching step and the washing step by ejecting (spraying) an electroless plating solution, an etching solution and a washing solution onto the surface of the substrate to be treated in the same way as in the above-mentioned method.

A device for forming a plating film according to the present invention comprises a plating solution supplying unit for supplying an electroless plating solution to a surface of a substrate to be treated, an etching solution supplying unit for supplying an etching solution to the surface of the substrate to be treated, and a control unit for repeating alternately the supply of the electroless plating solution to the surface of the substrate to be treated and the supply of the etching solution to the surface of the substrate to be treated.

Another device for forming a plating film according to the present invention comprises an electroless plating solution supplying unit for supplying a plating solution to a surface of a substrate to be treated, an etching solution supplying unit for supplying an etching solution to the surface of the substrate to be treated, a washing solution supplying unit for supplying a washing solution to the surface of the substrate to be treated, and a control unit for repeating the supply of the electroless plating solution to the surface of the substrate to be treated, the supply of the etching solution on the surface of the substrate to be treated, and the supply of the washing solution on the surface of the substrate to be treated.

A still another device for forming a plating film according to the present invention comprises a container which contains an electroless solution for subjecting electroless plating to a surface of a substrate to be treated, an etching unit in which the electroless plating solution contained in the container is used to perform applied electric bias etching on the substrate subjected to the electroless plating, and a control unit for performing, alternately and repeatedly, the electroless plating and the applied electric bias etching.

By using any one of these devices, the electroless plating film can be formed while an abnormal growth region of the electroless plating film based on the singular point of the underlayer or the like, is etched in the same way as in the above-mentioned method. For this reason, the formed electroless plating film can be made smooth and excellent in step coverage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a schematic view illustrating a device for forming a plating film according to a second embodiment of the present invention.

DETAILED DESCRIPTION OF THE INVENTION

Referring to the attached drawings, embodiments of the present invention will be described hereinafter.
[First embodiment]

Figure 1:
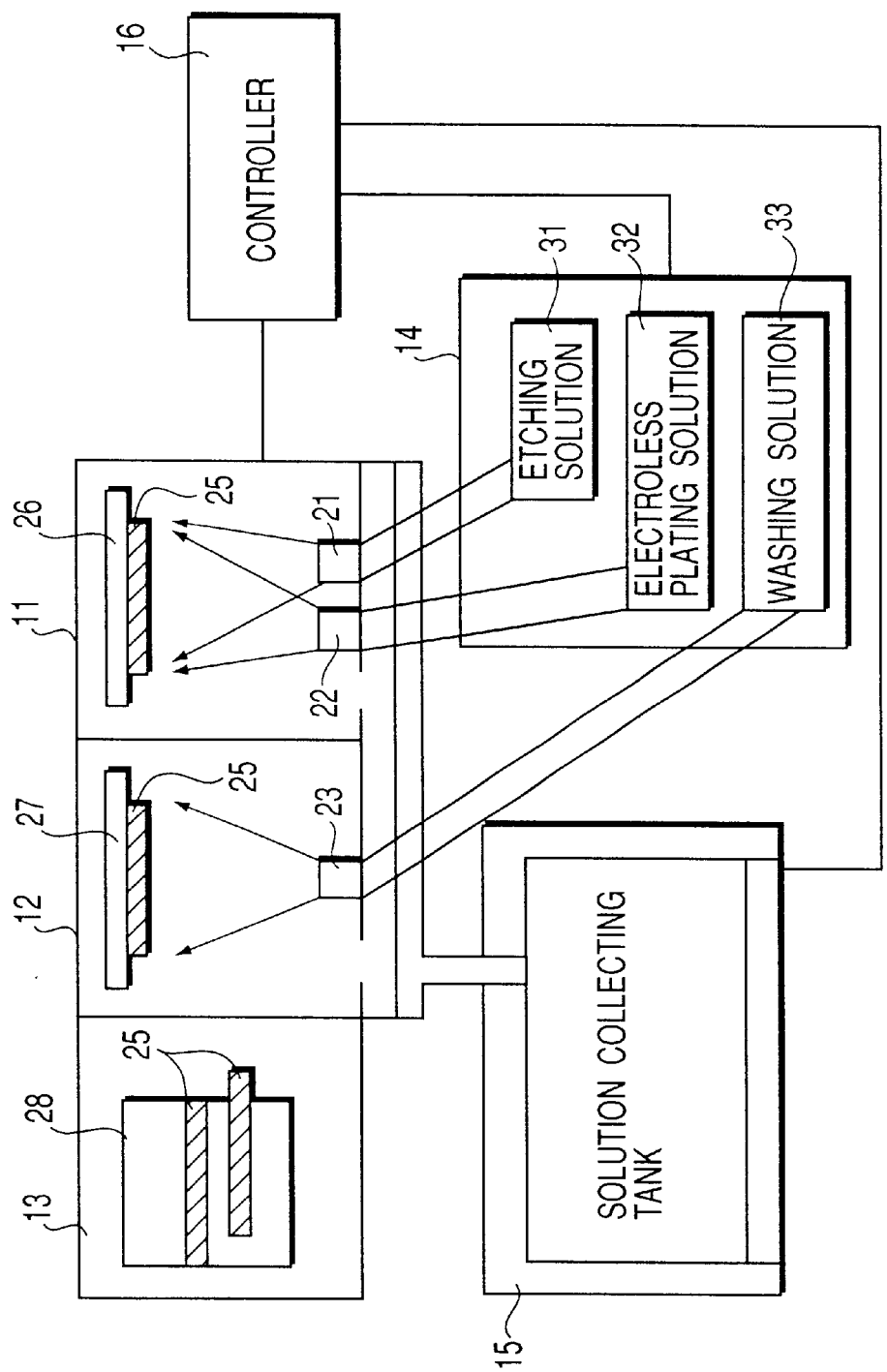
FIG. 1 is a schematic view illustrating a device for forming a plating film according to a first embodiment of the present invention.

FIG. 1 is a schematic view illustrating a device for forming a plating film according to a first embodiment of the present invention. Respective elements of the present device will be described hereinafter.

In FIG. 1, reference number 11 illustrates a film-depositing/etching chamber. This film-depositing/etching chamber 11 has therein a support 26 for supporting a semiconductor wafer 25. The semiconductor wafer 25 is a substrate to which electroless plating is to be applied.

Nozzles 21 and 22 are provided in the film-depositing/etching chamber 11, so as to face the support 26. An etching solution 31, which is supplied from a treating solution keeping unit 14, is ejected from the tip of the nozzle 21 onto the surface of the wafer 25. An electroless plating solution 32, which is supplied from the treating solution keeping unit 14, is ejected from the tip of the nozzle 22 onto the surface of the wafer 25.

The etching solution 31 and the electroless plating solution 32 are alternately supplied onto the surface of the wafer 25 through a controller 16 (control unit).

In the present embodiment, the nozzle 21 only for the etching solution and the nozzle 22 only for the electroless plating solution are separately arranged. However, the etching solution and the electroless plating solution may be alternately supplied from a single nozzle onto the surface of the wafer 25. In the case in which it is undesired that a film is deposited on the back face of the wafer 25, a member for covering the back face of the wafer wholly should be used.

In FIG. 1, reference number 12 represents a washing chamber. This washing chamber 12 is arranged adjacently to the film-depositing/etching chamber 11. The washing chamber 12 is a chamber for applying washing and the like to the semiconductor wafer 25 supported by a supporter 27 before film-deposition.

A nozzle 23 is provided in the washing chamber 12, so as to face the supporter 27. A washing solution 33, which is supplied from the treating solution keeping unit 14, is ejected from the tip of the nozzle 23 onto the surface of the wafer 25.

A cassette chamber (wafer holding chamber) 13 is arranged adjacently to the washing chamber 12. In this chamber, the wafer 25 is set into a wafer carrier 28.

A treating solution collecting tank 15 for collecting the treating solutions (the etching solution, the electroless plating solution and the washing solution) is connected to the film-depositing/etching chamber 11 and the washing chamber 12, so that the respective treating solutions used for the respective treatments are collected.

The film-depositing/etching chamber 11, the washing chamber 12 and the cassette chamber 13 are isolated by isolating walls which can freely be opened and closed. The wafer 25 can be shifted from one of the chambers to the other chamber adjacent thereto by a carrying means (not illustrated) controlled by the controller 16.

The following will describe a method of forming a plating film, using the device illustrated in FIG. 1.

The semiconductor wafer 25, which is a substrate to be treated, is pre-washed in the washing chamber 12, and subsequently is carried in the film-depositing/etching chamber 11 to perform electroless plating. In the case that, for example, Cu plating is performed as the electroless plating, a solution containing sulfuric acid (for example, a copper sulfate solution) and a copper sulfate solution containing formaldehyde may be used as the etching solution 31 and the electroless plating solution 32, respectively.

The control by the controller 16 causes the following steps to be performed alternately and continuously: the electroless plating step of ejecting the electroless plating solution from the nozzle 22 onto the wafer 25, and the etching step of ejecting the etching solution from the nozzle 21 onto the wafer 25. As a result, an electroless plating film of Cu is formed on the semiconductor wafer.

For example, a film-depositing step for 30 seconds and a first etching step for 5 seconds are repeated 5 times, as follows: a first film-depositing step→a first etching step→a second film-depositing step→a second etching step→a third film-depositing step→a third etching step→a fourth film-depositing step→a fourth etching step→a fifth film-depositing step→a fifth etching step (thereafter, an etching step may be performed.) The interval between the film-depositing step and the etching step is 1 seconds.

Figure 2:
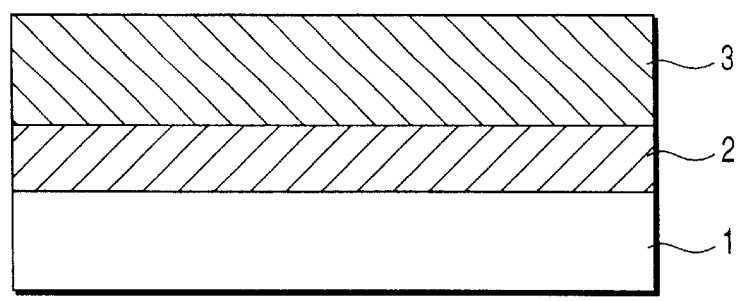
FIG. 2 is a cross section illustrating a sectional shape of the plating film obtained by the method according to the first embodiment of the present invention.

As shown in FIG. 2, by repeating the electroless plating (film-deposition) and the etching in the above-mentioned way at the time of depositing an electroless plating film 3 on an underlayer 1 (the silicon substrate or insulating film) through a seed layer 2, the electroless plating film 3 can be deposited while an abnormal growth region of the electroless plating film 3, which is caused by the singular point of the underlayer, is etched. For this reason, the formed electroless plating film 3 can be made smooth and continues. Dust can also be prevented from being generated.

Figure 4:
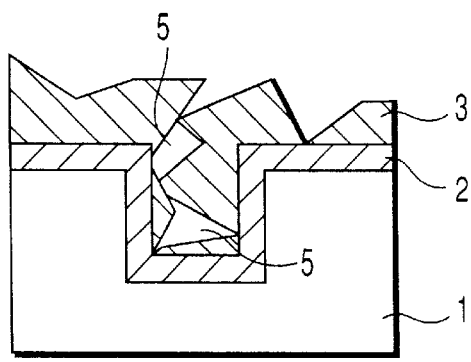
FIG. 4 is a cross section illustrating a sectional shape of a plating film obtained by a method of forming a plating film in the prior art.

Concerning step coverage, the following results are obtained. As shown in FIG. 4, if the underlayer 1 having steps (or grooves) is subjected to electroless plating in the conventional way, voids 5 are unfavorably generated so that continues wiring cannot be formed by means of the electroless plating film 3.

Figure 3A:
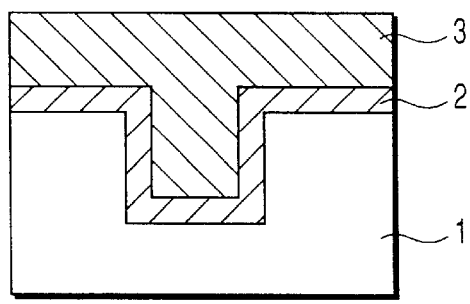
FIGS. 3A and 3B are cross sections illustrating sectional shapes of other plating films obtained by the same method.

By using the method of the present embodiment, however, it is possible to obtain the continues electroless plating film 3 having no voids as shown in FIG. 3A. It is also possible to make the surface of the electroless plating film 3 smooth. Additionally, the electroless plating can be performed in the state that the surface of the substrate is cleaned since the treating solutions can freshly be supplied from the respective nozzles at any time.

Figure 3B:
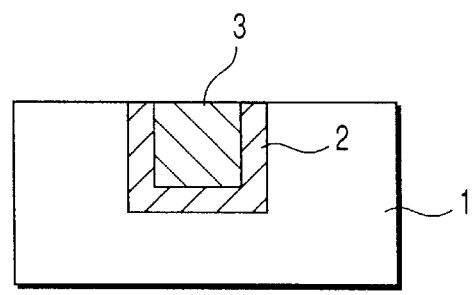

In the case of forming a single damascene structure by using the method of the present embodiment, after the step shown in FIG. 3A, as shown in FIG. 3B, the excess electroless plating film 3 (wiring) and the seed layer 2 which is present outside the grooves is removed by CMP (chemical mechanical polishing). In this case, the underlayer 1 is made up to an interlayer insulating film formed on the semiconductor substrate.

It is preferable that a barrier metal film is formed in each of the wiring grooves before the electroless plating film (wiring) 3 is formed. In particular in the case of Cu wiring, the barrier metal film is necessary since Cu is easily diffused. If necessary, a CMP stopper film is beforehand formed.

In the same way, a dual damascene structure can be formed. In the case of the dual damascene wiring structure, it is necessary to embed a plating film in via holes as well as the wiring grooves. That is, it is necessary that the grooves having a high aspect ratio (for example, 4) are filled with a plating film. If the method of the present invention is used, it is possible to embed a Cu film (wiring) in grooves having a high aspect ratio without generating any voids, and realize the Cu wiring of the fine dual damascene structure.

[Second embodiment]

FIG. 5 is a schematic view illustrating a device for forming a plating film according to a second embodiment of the present invention. The basic structure of the present device is similar to the structure of the first embodiment shown in FIG. 1. The same reference numbers are attached to the same or corresponding elements. Thus, the detailed explanation thereof is omitted herein.

In the present device, the film-depositing/etching chamber 11 has therein a nozzle 24 for supplying a washing solution, as well as the nozzle 21 for supplying an etching solution and the nozzle 22 for supplying an electroless plating solution. Thus, the etching solution 31, the electroless plating solution 32 and the washing solution 34 can be repeatedly supplied from the respective nozzles onto the surface of the wafer 25 by control of the controller 16.

The nozzle 21 only for the etching solution, the nozzle 22 only for the electroless plating solution, and the nozzle 24 only for the washing solution may not be arranged separately. The etching solution, the electroless plating solution and the washing solution may be supplied onto the surface of the wafer 25 from one or more nozzles.

The following will describe a method of forming a plating film, using the device illustrated in FIG. 5.

The semiconductor wafer 25, which is a substrate to be treated, is pre-washed in the washing chamber 12, and subsequently is carried in the film-depositing/etching chamber 11 to perform electroless plating. In the case that, for example, Cu plating is performed as the electroless plating, a solution containing sulfuric acid (for example, a copper sulfate solution) and a copper sulfate solution containing formaldehyde may be used as the etching solution 31 and the electroless plating solution 32, respectively.

The control by the controller 16 causes the following steps to be performed alternately and continuously: the electroless plating step of ejecting the electroless plating solution from the nozzle 22 onto the wafer 25, the etching step of ejecting the etching solution from the nozzle 21 onto the wafer 25, and the washing step of ejecting the washing solution from the nozzle 24 to the wafer 25. As a result, an electroless plating film of Cu is formed on the semiconductor wafer.

For example, a film-depositing step for 30 seconds, an etching step for 5 seconds, and a washing step for 5 seconds are repeated as follows: a first washing step→a first film-depositing step→a second washing step→a first etching step→a third washing step→a second film-depositing step→a fourth washing step→a second etching step→a fifth washing step→a third film-depositing step→a sixth washing step→a third etching step→a seventh washing step→a fourth film-depositing step→an eighth washing step→a fourth etching step→a ninth washing step→a fifth film-depositing step (thereafter, an etching step may be performed.) The interval between the film-depositing step and the washing step and the intervals between the etching step and the washing step are 1 seconds, respectively. The order of the respective steps is not limited to the above-mentioned example, and may be appropriately changed. The washing step may be performed only before the film-depositing step, or only before the etching step.

By repeating the electroless plating (film-deposition), the etching and the washing in the above-mentioned way, the metal plating film can be deposited while an abnormal growth region of the metal plating film, which is caused by the special point of the underlayer, is etched in the same way as in the first embodiment. For this reason, the formed electroless plating film can be made smooth and continues.

Concerning step coverage, the continues electroless plating film can be obtained without any voids by using the method of the present embodiment. Additionally, the electroless plating can be performed in the state that the surface of the substrate is cleaned since the treating solutions can freshly be supplied from the respective nozzles at any time. The same advantages as the first embodiment has can also be obtained.

[Third embodiment]

Figure 6:
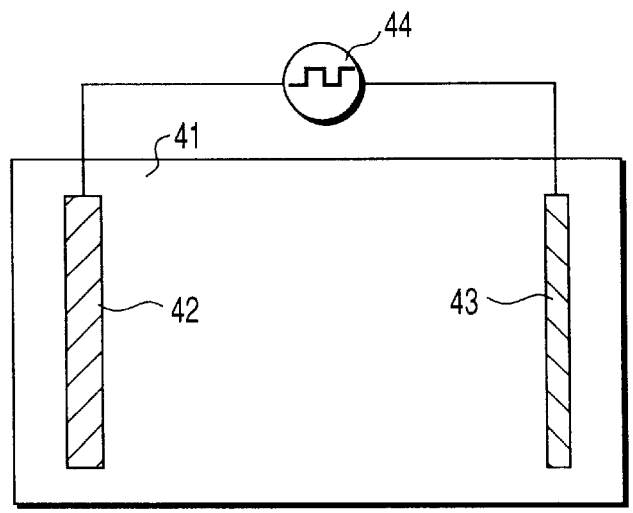
FIG. 6 is a schematic view illustrating a device for forming a plating film according to a third embodiment of the present invention.
Figure 7:
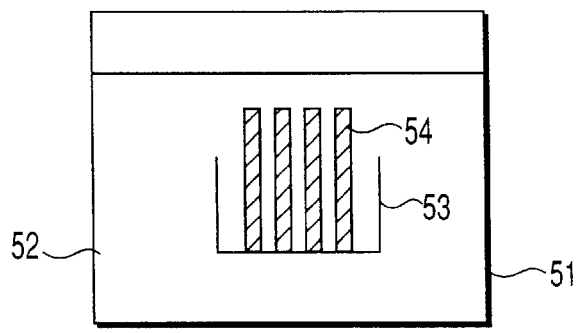
FIG. 7 is a schematic view illustrating a device for forming a plating film in the prior art.
Figure 8:
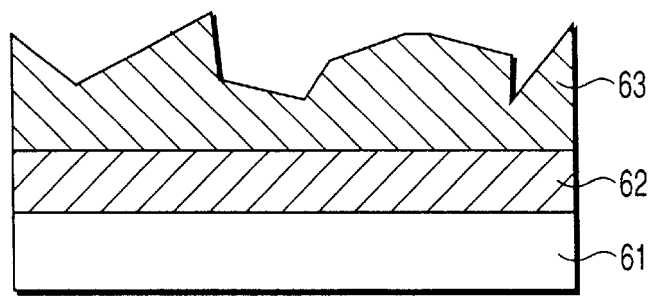
FIG. 8 is a cross section illustrating a sectional shape of a plating film obtained by a method of forming a plating film in the prior art.

FIG. 6 is a schematic view illustrating a device for forming a plating film according to a third embodiment of the present invention. In the present device, a semiconductor substrate 42, which is a substrate to be treated, is immersed in an electroless plating solution 41 put in a given container, and electroless plating is performed. In addition, a plate electrode 43 for applied electric etching is immersed in the electroless plating solution 41, and voltage is applied between the semiconductor substrate 42 and the plate electrode 43 from a power supply 44, to perform applied electric bias etching.

In the case of, for example, Cu plating, a copper sulfate solution containing formaldehyde may be used as the electroless plating solution. In the case of performing etching, positive voltage is applied to the substrate 42 from the power supply 44, so as to etch the Cu plating film deposited on the substrate by electroless plating.

Therefore, applied electric bias etching is performed by applying voltage intermittently (in a pulse state) to the substrate 42. A smooth electroless plating film having no voids can be formed by controlling the device in such a manner that electroless plating and applied electric bias etching are alternately performed. The same advantages as the first embodiment has can also be obtained.

In the respective embodiments described above, it is not necessarily essential that the periods when film-deposition and etching treatment are performed are independent. That is, both the periods when these treatments are performed may overlap.

For example, at the same time when a film-depositing treatment is finished, an etching treatment may be started. In addition, at the same time when the etching treatment is finished, a film-depositing treatment may be started. In this way, the one treatment can be finished so that the degree thereof is gradually weakened while the other treatment is advanced so that the degree thereof is gradually strengthened.

In the above-mentioned embodiments, it is sufficient that the number of the etching steps, that of the film-depositing steps, and that of the washing steps are two or more, respectively. The number thereof is not limited.

The time for each of the etching steps may be different or the same. This is true for the film-depositing steps, or the washing steps.

The kinds of the etching solution and the electroless plating solution are not limited if they can exhibit desired properties.

In the above-mentioned embodiments, Cu is used for electroless plating. However, there may be used Au, Ag, Pt, Ni or the like.

Sensitizing may be performed before the film-deposition. For example, film deposition may be continuously performed after a sensitizing solution is jetted out in the washing chamber or the film-depositing chamber, to perform sensitization.

The embodiments of the present invention has been described above, but the present invention is not limited to these embodiments, and may be modified within the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a plating film, comprising the steps of:
   providing a substrate to be treated, and
   performing, alternately and repeatedly, a step of depositing material of the plating film based on electroless plating and a step of etching the material, to form the plating film on a surface of the substrate.

2. A method for forming the plating film according to claim 1, wherein in the step of depositing the material, an electroless plating solution is ejected onto the surface of the substrate, and in the step of etching the material, an etching solution is ejected onto the surface of the substrate.

3. A method for forming the plating film according to claim 1, wherein in the step of depositing the material, the substrate is immersed in an electroless plating solution to perform the electroless plating, and in the step of etching the material, the electroless plating solution used in the step of depositing the material is used to perform applied reverse electric bias etching.

4. A method for forming the plating film according to claim 1, wherein the plating film is a Cu film.

5. A method for forming the plating film according to claim 4, wherein the substrate comprises a semiconductor substrate and an insulating film formed on the semiconductor substrate and having, in its surface, a groove.

6. A method for forming a plating film, comprising the steps of:
   providing a substrate to be treated, and
   performing repeatedly a step of depositing material of the plating film based on electroless plating, a step of etching the material, and a washing step, to form the plating film on a surface of the substrate.

7. A method for forming the plating film according to claim 6, wherein in the step of depositing the material an electroless plating solution is ejected onto the surface of the substrate; in the step of etching the material, an etching solution is ejected onto the surface of the substrate; and in the washing step a washing solution is ejected onto the surface of the substrate.

8. A method for forming the plating film according to claim 6, wherein the plating film is a Cu film.

9. A method for forming the plating film according to claim 8, wherein the substrate comprises a semiconductor substrate and an insulating film formed on the semiconductor substrate and having, in its surface, a groove.

10. A method for forming the plating film according to claim 6, wherein in the step of performing repeatedly, first, the washing step, second, the step of depositing the material, third, the washing step, fourth, the step of etching the material, is repeated.

* * * * *